US011923371B2

(12) United States Patent
Sharma et al.

(10) Patent No.: US 11,923,371 B2
(45) Date of Patent: Mar. 5, 2024

(54) VOLTAGE REGULATOR CIRCUIT INCLUDING ONE OR MORE THIN-FILM TRANSISTORS

(71) Applicant: Intel Corporation, Santa Clara, CA (US)

(72) Inventors: Abhishek A. Sharma, Hillsboro, OR (US); Van H. Le, Portland, OR (US); Seung Hoon Sung, Portland, OR (US); Ravi Pillarisetty, Portland, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 657 days.

(21) Appl. No.: 16/630,368

(22) PCT Filed: Sep. 29, 2017

(86) PCT No.: PCT/US2017/054439
§ 371 (c)(1),
(2) Date: Jan. 10, 2020

(87) PCT Pub. No.: WO2019/066931
PCT Pub. Date: Apr. 4, 2019

(65) Prior Publication Data
US 2020/0168634 A1    May 28, 2020

(51) Int. Cl.
*H01L 27/12* (2006.01)
*G05F 1/56* (2006.01)
(Continued)

(52) U.S. Cl.
CPC ............ *H01L 27/1207* (2013.01); *G05F 1/56* (2013.01); *G06F 1/26* (2013.01); *H01L 21/0214* (2013.01);
(Continued)

(58) Field of Classification Search
None
See application file for complete search history.

(56) References Cited

U.S. PATENT DOCUMENTS 8,766,608 B2    7/2014  Yamazaki et al.
2010/0090667 A1    4/2010  Gleason et al.
(Continued)

FOREIGN PATENT DOCUMENTS

JP    2011-171703    9/2011

OTHER PUBLICATIONS

International Search Report and Written Opinion for International Patent Application No. PCT/US2017/054439 dated Jun. 28, 2018, 13 pgs.
(Continued)

*Primary Examiner* — Daniel Whalen
(74) *Attorney, Agent, or Firm* — Schwabe, Williamson & Wyatt, P.C.

(57) ABSTRACT

Described herein are apparatuses, systems, and methods associated with a voltage regulator circuit that includes one or more thin-film transistors (TFTs). The TFTs may be formed in the back-end of an integrated circuit. Additionally, the TFTs may include one or more unique features, such as a channel layer treated with a gas or plasma, and/or a gate oxide layer that is thicker than in prior TFTs. The one or more TFTs of the voltage regulator circuit may improve the operation of the voltage regulator circuit and free up front-end substrate area for other devices. Other embodiments may be described and claimed.

8 Claims, 7 Drawing Sheets

(51) Int. Cl.
    *G06F 1/26*     (2006.01)
    *H01L 21/02*     (2006.01)
    *H01L 21/383*     (2006.01)
    *H01L 29/24*     (2006.01)
    *H01L 29/423*     (2006.01)
    *H01L 29/49*     (2006.01)
    *H01L 29/66*     (2006.01)
    *H01L 29/786*     (2006.01)

(52) U.S. Cl.
    CPC .... *H01L 21/02164* (2013.01); *H01L 21/0217* (2013.01); *H01L 21/02178* (2013.01); *H01L 21/02181* (2013.01); *H01L 21/02183* (2013.01); *H01L 21/02186* (2013.01); *H01L 21/02192* (2013.01); *H01L 21/02565* (2013.01); *H01L 21/383* (2013.01); *H01L 27/1225* (2013.01); *H01L 29/24* (2013.01); *H01L 29/42384* (2013.01); *H01L 29/4908* (2013.01); *H01L 29/66969* (2013.01); *H01L 29/7869* (2013.01); *H01L 29/78696* (2013.01); *H01L 2029/42388* (2013.01)

(56) References Cited

U.S. PATENT DOCUMENTS

| | | | |
|---|---|---|---|
| 2010/0271116 | A1 | 10/2010 | Shirokov et al. |
| 2011/0089927 | A1 | 4/2011 | Yamazaki et al. |
| 2011/0101942 | A1* | 5/2011 | Yamazaki ............... H02M 3/07 257/43 |
| 2013/0037798 | A1* | 2/2013 | Wong .................. H01L 29/7869 438/164 |
| 2013/0320328 | A1* | 12/2013 | Lee ..................... H01L 29/7869 257/43 |
| 2014/0117957 | A1 | 5/2014 | Usuda |
| 2015/0053970 | A1* | 2/2015 | Lee ..................... H01L 29/7869 257/43 |
| 2015/0280013 | A1* | 10/2015 | Yamazaki ........... H01L 27/0688 257/43 |
| 2018/0047756 | A1* | 2/2018 | Yoshida ............. H01L 27/1207 |

OTHER PUBLICATIONS

International Preliminary Report on Patentablity for International Patent Application No. PCT/US2017/054439 dated Apr. 9, 2020, 10 pgs.

* cited by examiner

VOLTAGE REGULATOR CIRCUIT INCLUDING ONE OR MORE THIN-FILM TRANSISTORS

CROSS-REFERENCE TO RELATED APPLICATION

This patent application is a U.S. National Phase Application under 35 U.S.C. § 371 of International Application No. PCT/US2017/054439, filed Sep. 29, 2017, entitled "VOLTAGE REGULATOR CIRCUIT INCLUDING ONE OR MORE THIN-FILM TRANSISTORS," which designates the United States of America, the entire disclosure of which is hereby incorporated by reference in its entirety and for all purposes.

TECHNICAL FIELD

Embodiments of the disclosure are in the field of integrated circuits and, in particular, to voltage regulator circuits including one or more thin-film transistors.

BACKGROUND

Voltage regulator circuits are used to convert an input voltage (e.g., a main supply voltage) to a regulated output voltage that may be used by one or more circuit blocks. Voltage regulator circuits using traditional front-end transistors, such as silicon-based metal-oxide-semiconductor (MOS) or bipolar junction (BJT) transistors, consume front-end substrate area. Additionally, the voltage regulators operate at relatively low frequency because of the low on/off ratio (the ratio of the current through the transistor when the transistor is on compared with the current through the transistor when the transistor is off) and large parasitic capacitance of the front-end transistors. Furthermore, the voltage regulators are not scalable to smaller sizes (e.g., due to difficulty in scaling the passive elements in MOS field effect transistor (MOSFET)-based voltage regulators and/or difficulty in junction scaling for BJT-based voltage regulators). Moreover, the limitations of front-end voltage regulators require the use of multiple stage voltage regulators, which limits the efficiency of the voltage regulator circuit.

DESCRIPTION OF THE EMBODIMENTS

Figure 1:
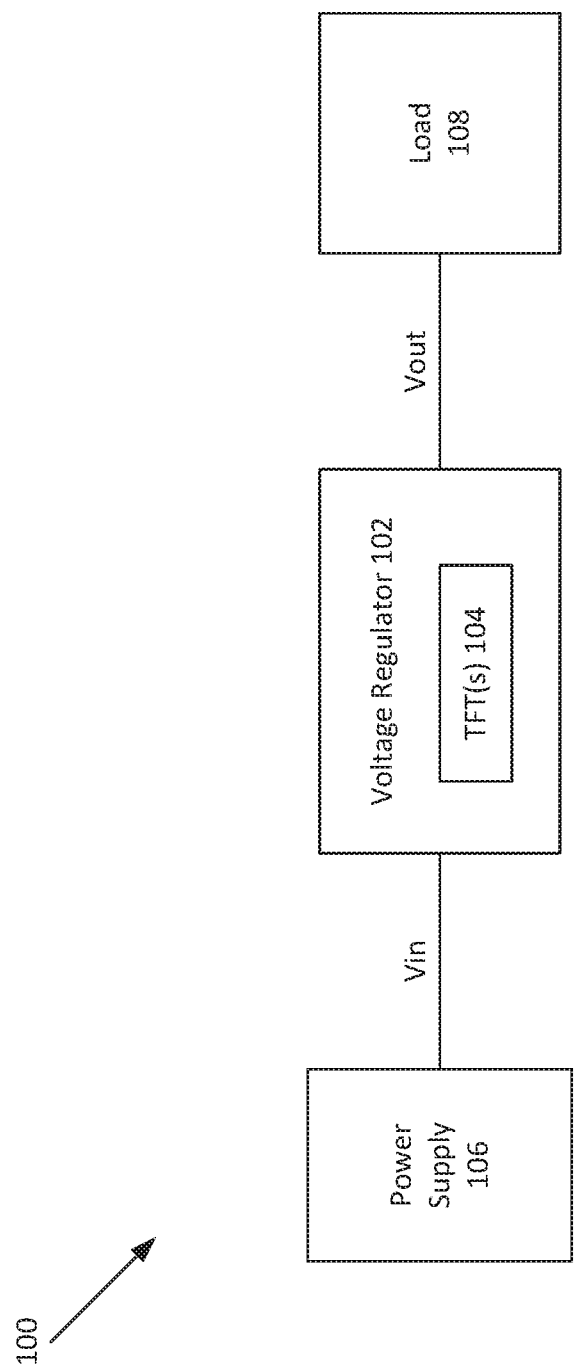
FIG. 1 schematically illustrates a circuit including a voltage regulator circuit having one or more thin-film transistors, in accordance with various embodiments.

Described herein are voltage regulator circuits including one or more thin-film transistors (TFTs), and associated methods, apparatuses, and systems. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Various embodiments described herein are directed to a voltage regulator circuit including one or more TFTs. The voltage regulator may receive an input voltage (e.g., from a power supply) and generate a regulated output voltage. The regulated output voltage may be provided to a load (e.g., one or more circuit blocks). In various embodiments, the voltage regulator and the load may be integrated on the same IC die.

In some embodiments, the IC die may include a plurality of voltage regulators to provide a regulated output voltage to respective circuit blocks of the IC die.

In various embodiments, the one or more TFTs of the voltage regulator may provide several advantages over prior voltage regulator circuits. For example, the TFTs may be back-end transistors formed by BEOL processing. Accordingly, the TFTs may not use up front-end substrate area (e.g., silicon), thereby reducing size and cost of the integrated circuit die. Additionally, the patterning of the TFTs is decoupled from the front-end substrate patterning, and therefore no additional block mask is needed to pattern the voltage regulator transistors in the FEOL processing.

Additionally, the one or more TFTs included in the voltage regulator may include one or more novel features that provide the voltage regulator with increased performance and/or enable the voltage regulator circuit to use one or more TFTs rather than front-end transistors. For example, the channel layer of the TFT may be treated with one or more gases or plasmas to provide the channel layer with increased mobility compared to other TFTs. The one or more gases or plasmas may include, for example, nitrogen (e.g., N, $N_2O$, and/or NO), argon, fluorine, chlorine, and/or xenon. In some embodiments, treatment with the one or more gases or plasmas may provide the TFT with a mobility of 20 to 500 centimeters per volt-second ($cm^2/(V*s)$), such as 100 to 500 $cm^2/(V*s)$ or 200 to 500 $cm^2/(V*s)$. The high mobility may provide the TFT with high drive current, which, in turn, may increase the on/off ratio of the TFT (e.g., the ratio of the current through the TFT when the TFT is on compared with the current through the TFT when the TFT is off). The high on/off ratio improves the performance of the voltage regulator. Additionally, the low leakage of the TFT enables the voltage regulator to use smaller passive devices (e.g., capacitors, inductors), thereby reducing the size, cost, and complexity of the integrated circuit die.

Additionally, or alternatively, the TFT may have a gate oxide layer (also referred to as a gate dielectric) that is thicker than the gate oxide layer on other TFTs. For example, in some embodiments, the gate oxide may have a thickness of 5 nanometers (nm) to 30 nm, such as 10 nm to 30 nm or 20 nm to 30 nm. The increased thickness of the gate oxide layer may enable a higher voltage to be applied to the gate terminal of the TFT. In prior TFTs, the gate oxide is designed to be thinner to provide the TFT with a high drive current. However, the increased mobility provided by the doped channel layer (e.g., doped with one or more of nitrogen, argon, fluorine, chlorine, or xenon as described above) may enable the gate oxide to be thicker (and thereby enable a higher voltage to be applied to the gate) while still having a high drive current.

Accordingly, the TFT may have a relatively low capacitance (e.g., overlap capacitance between the gate and the source or drain (Cov) and/or the capacitance between the gate and the channel (Cgg)), which enables the voltage regulator to operate at a higher frequency. Additionally, the voltage regulator described herein may operate over a higher voltage range than prior voltage regulators. These advantages may improve the efficiency of the voltage regulator and/or enable the voltage regulator to use fewer stages (e.g., a one-stage voltage regulator in an implementation that would previously have required multiple stages).

FIG. 1 illustrates a circuit 100 including a voltage regulator 102 having one or more TFTs 104, in accordance with various embodiments. The voltage regulator 102 may receive an input voltage Vin (e.g., from a power supply 106) and generate a regulated output voltage Vout. In some embodiments, the output voltage Vout may be provided to a load 108. The load 108 may be one or more circuit blocks that may, for example, use the output voltage Vout as a supply voltage. In some embodiments, the voltage regulator circuit 102 and the load 108 may be included in the same integrated circuit die. The power supply 106 may be any suitable power supply 106 such as a battery or a power supply circuit that receives electrical power from a wall outlet. In some embodiments, the power supply 106 may include an alternating current-to-direct current (AC/DC) converter to convert an AC voltage into a DC voltage and provide the DC voltage to the voltage regulator circuit 102 as the input voltage Vin.

In various embodiments, the voltage regulator 102 may provide the output voltage Vout with a regulated voltage level that is substantially constant, even with variation in the voltage level of the input voltage Vin and/or the characteristics of the load 108 (e.g., the load impedance and/or current draw). The voltage regulator 102 may be any suitable type of voltage regulator, such as a linear voltage regulator, a switching voltage regulator. Additionally, or alternatively, the voltage regulator 102 may be a buck converter in some embodiments. The linear regulator may operate the one or more TFTs 104 in the linear region to generate the regulated output voltage Vout, while the switching voltage regulator may switch the one or more TFTs 104 on and off to generate the regulated output voltage Vout (e.g., based on the duty cycle of the switching). In some embodiments, the voltage regulator 102 may use a feedback loop to generate the output voltage Vout with the desired voltage level.

Figure 2:
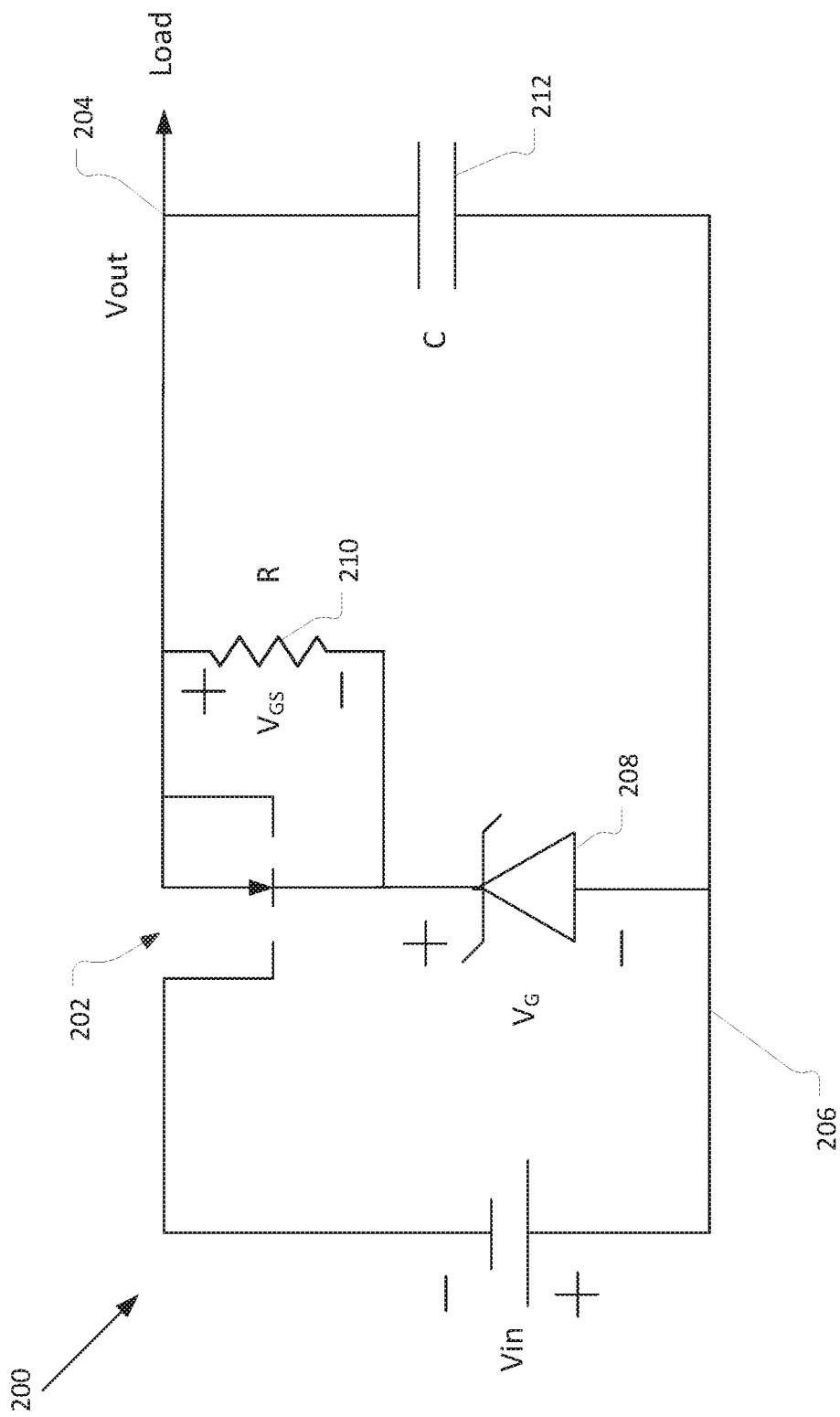
FIG. 2 schematically illustrates a voltage regulator circuit including a thin-film transistor, in accordance with various embodiments.

FIG. 2 illustrates a voltage regulator circuit 200 including a TFT 202 in accordance with some embodiments. The embodiments disclosed herein for a voltage regulator including one or more TFTs are applicable to a wide variety of voltage regulator circuit topologies, and the specific voltage regulator 200 depicted in FIG. 2 is provided as merely one example. The voltage regulator circuit 200 may receive an input voltage Vin and generate an output voltage Vout at an output node 204. The output voltage Vout may be provided to a load (e.g., load 108 of FIG. 1). In some embodiments, the voltage regulator circuit 200 may be integrated with the load on the same integrated circuit die.

The voltage regulator 200 may be a linear voltage regulator that provides the output voltage Vout with a substantially constant voltage level even with changing load conditions. The input voltage Vin may be coupled between the drain terminal of the TFT 202 and a reference node 206, and the source terminal of the TFT 202 may be coupled to the output node 204 to provide the output voltage Vout. Additionally, a diode 208 (e.g., a Zener diode) may be coupled between the gate terminal of the TFT 202 and the reference node 206. A resistor 210 may be coupled between the output node 204 and the gate terminal of the TFT 202, and a capacitor 212 may be coupled between the output node 204 and the reference node 206. It will be apparent that other circuit components and/or arrangements may be used in other embodiments to provide a regulated output voltage Vout.

As discussed above, the one or more TFTs included in the voltage regulator (e.g., the one or more TFTs 104 of voltage regulator circuit 102 and/or the TFT 202 of voltage regulator circuit 200) as described herein may include one or more novel features that improve the operation of the voltage regulator circuit and/or enable the voltage regulator circuit to use one or more TFTs rather than front-end transistors (and thereby save front end substrate area for other devices, such as logic transistors).

Figure 3:
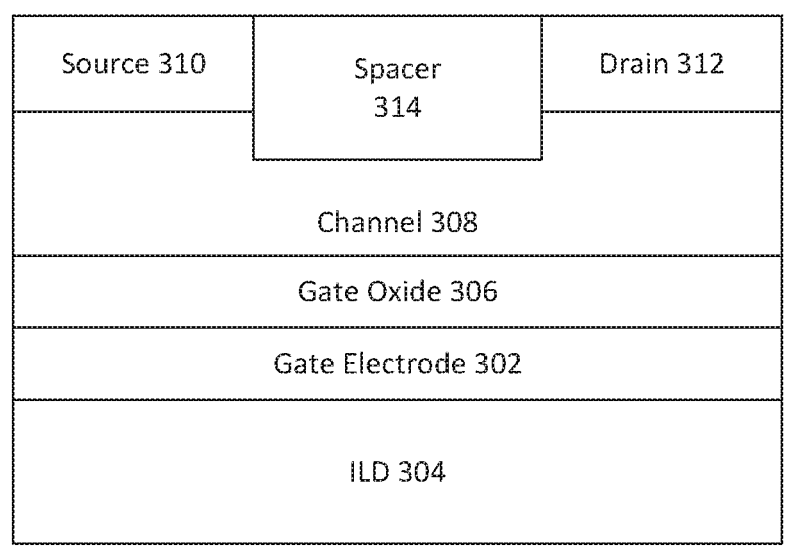
FIG. 3 illustrates a cross-sectional view of a thin-film transistor that may be included in a voltage regulator circuit, in accordance with various embodiments.

FIG. 3 illustrates a TFT 300 that may be included in a voltage regulator in accordance with various embodiments. For example, TFT 300 may correspond to TFT 104 of voltage regulator circuit 102 and/or TFT 202 of voltage regulator circuit 200. The TFT 300 may include a gate electrode 302 formed on an ILD layer 304. The gate electrode may include one or more material layers, and may include any suitable material or materials as discussed above. The ILD layer 304 may include any suitable dielectric material as discussed above. In some embodiments, the ILD layer 304 may be formed over one or more additional layers of an IC device. For example, the ILD layer 304 may be formed over a substrate, one or more device layers (e.g., including front-end transistors, such as logic transistors) and/or one or more interconnect layers, e.g., as shown in IC device 400 depicted in FIG. 4.

The TFT 300 may further include a gate oxide (also referred to as a gate dielectric) 306 formed above the gate electrode 302. The gate oxide may be in direct contact with the gate electrode 302 in some embodiments. In other embodiments, one or more intervening layers may be disposed between the gate electrode 302 and the gate oxide 306 in a gate stack. The gate oxide 306 may include any suitable material, such as silicon and nitrogen (e.g., SiN); hafnium and oxygen (e.g., $HfO_2$); aluminum and oxygen (e.g., $Al_2O_3$); silicon and oxygen (e.g., $SiO_2$); aluminum and nitrogen (e.g., AlN); silicon, oxygen, and nitrogen (e.g., SiON); yttrium and oxygen (e.g., $Y_2O_3$); tantalum and oxygen (e.g., $Ta_2O$); and/or titanium and oxygen (e.g., $TiO_2$).

In various embodiments, the TFT 300 may further include a channel layer (e.g., thin film channel) 308 formed over (e.g., on) the gate oxide 306. A source electrode 310 and a drain electrode 312 may be formed over (e.g., on) the channel 308. A spacer 314 may be formed over (e.g., on) the channel 308 between the source electrode 310 and the drain electrode 312. It will be apparent that other embodiments of the TFT 300 may include additional component layers that are not depicted in FIG. 3.

In various embodiments, the channel layer 308 may include a base material that is treated (e.g., doped) with one or more gases or plasmas, as discussed above. The base material of the channel layer 308 may include any suitable material, such as zinc and oxygen (e.g., ZnO); indium and oxygen (e.g., $InO_x$ with x from 0.5 to 2); indium, zinc, and oxygen (e.g., IZnO); indium, tin, and oxygen (e.g., ISnO (also referred to as ITO)); aluminum, zinc, and oxygen (e.g., aluminum-doped zinc oxide (AZO)), indium, zinc, and oxygen (e.g., IZO); indium, gallium, zinc, and oxygen (IGZO); gallium, zinc, and oxygen (e.g., GZO); gallium and oxygen (e.g., GO); gallium and nitrogen (e.g., gallium nitride); tin and oxygen (e.g., SnO); cobalt and oxygen (e.g., CoO); nickel and oxygen (e.g., NiO); copper and oxygen (e.g., CuO and/or $Cu_2O$); titanium and oxygen (e.g., $TiO_x$ with x from 0.5 to 2); amorphous silicon, amorphous germanium; poly silicon; poly germanium; poly germanium doped with boron; poly germanium doped with aluminum; poly germanium doped with phosphorous; poly germanium doped with arsenic; tungsten disulphide; molybdenum disulphide; molybdenum selenide; black phosphorus; indium antimonide; graphene; graphyne; borophene; germanene; silicene; $Si_2BN$; stanene; phosphorene; molybdenite; poly-III-V material such as InAs, InGaAs, or InP; amorphous InGaZnO (a-IGZO); crystal-like InGaZnO (c-IGZO); GaZnON; ZnON; and/or C-Axis Aligned Crystal (CAAC). The base material of the channel layer 308 may be an n-type material or a p-type material.

The one or more gases or plasmas with which the channel layer 308 may be treated may include, for example, nitrogen (e.g., N, $N_2O$, and/or NO), argon, fluorine, chlorine, and/or xenon. The channel layer 308 may be treated with any suitable process, such as an anneal process and/or a plasma treatment. The treatment may cause the atomic constituents of the one or more gases or plasmas to be incorporated into the channel layer 308 (e.g., by diffusion or bombardment). Accordingly, the channel layer 308 may include the base material and the atomic constituents of the one or more gases or plasmas. In one non-limiting example, the base material of the channel layer 308 may be IGZO, and the channel layer 308 may be treated with nitrogen and/or argon as the dopant. Therefore, the channel layer 308 may include indium, gallium, zinc, and oxygen from the base material and nitrogen or argon of the dopant.

The channel layer 308 may have any suitable concentration of the dopant. For example, in some embodiments, the concentration of the dopant in the channel layer 308 may be 1E16 to 1E19 atoms per cubic centimeter. In some embodiments, the channel layer 308 may include the dopant across the entire thickness of the channel layer 308 (e.g., 5 to 60 nanometers). Additionally, or alternatively, the dopant may be distributed substantially equally across the thickness of the channel layer 308 (e.g., without a concentration gradient). In other embodiments, the dopant may have a concentration gradient within the channel layer 308, with a higher concentration of the dopant at the top of the channel layer 308 (e.g., adjacent the source 310 and/or drain 312) than at a bottom of the channel layer 308 (e.g., adjacent the gate oxide 306). The dopant may have a concentration gradient, for example, when a plasma or gas anneal is used for the treatment. As discussed above, the dopant in the channel layer may provide the TFT 300 with increased mobility, thereby providing a high drive current.

Furthermore, in some embodiments, the thickness of the gate oxide layer 306 may be thicker than the gate oxide layer of other TFTs. For example, in some embodiments, the gate oxide layer 306 may have a thickness of 5 nanometers (nm) to 30 nm, such as 10 nm to 30 nm or 15 nm to 30 nm. The increased thickness of the gate oxide layer may enable a higher voltage to be applied to the gate terminal of the TFT and enable the voltage regulator circuit to operate at a higher frequency and/or with a higher voltage range, as described above.

Figure 4:
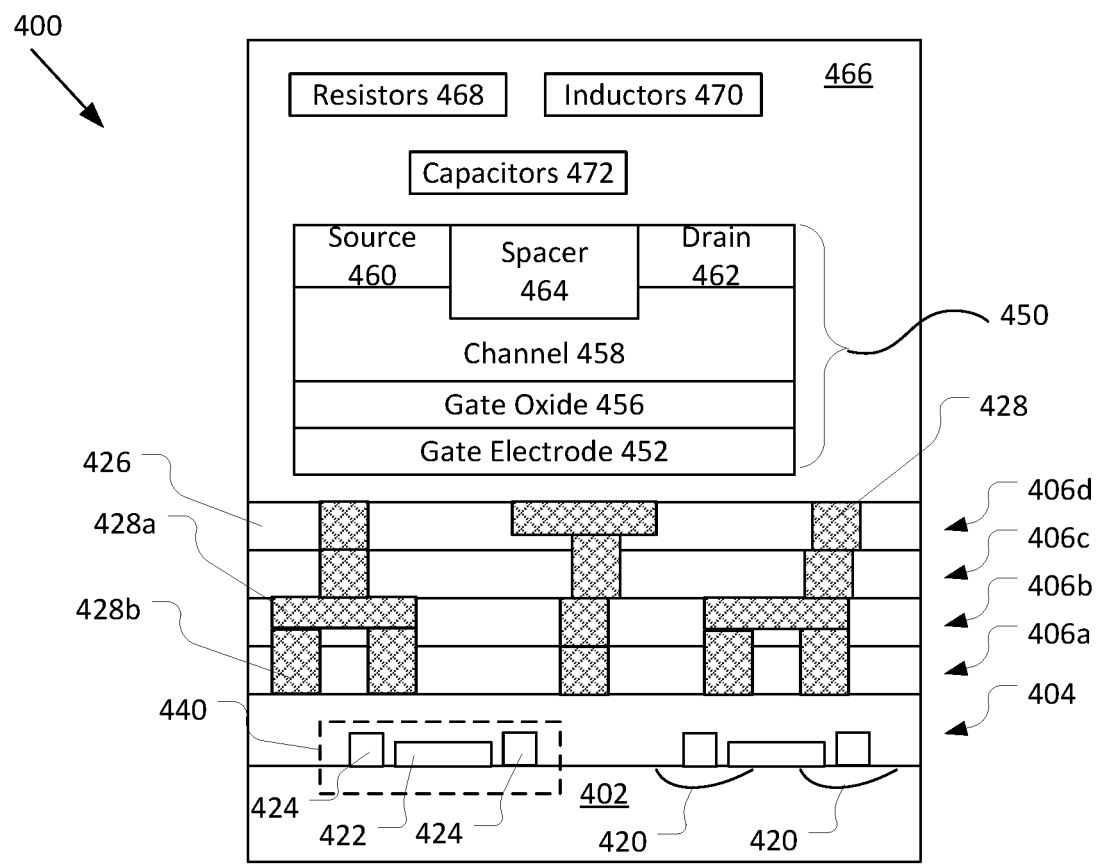
FIG. 4 illustrates a cross-sectional view of an integrated circuit device including a thin-film transistor of a voltage regulator circuit, in accordance with some embodiments.

FIG. 4 is a cross-sectional side view of an integrated circuit (IC) device 400 that may include a voltage regulator circuit (e.g., the voltage regulator circuit 102 or 200) including one or more TFTs 450 (e.g., corresponding to the one or more TFTs 104, the TFT 202, and/or the TFT 300), in accordance with one or more of the embodiments disclosed herein. The IC device 400 may be formed on a substrate 402 (e.g., the wafer 500 of FIG. 5, further discussed below) and may be included in a die (e.g., the die 502 of FIG. 6, further discussed below), which may be singulated or included in a wafer. Although a few examples of materials from which the substrate 402 may be formed are described, any material that may serve as a foundation for an IC device 400 may be used.

The IC device 400 may include one or more device layers, such as device layer 404, disposed on the substrate 402. The device layer 404 may include features of one or more transistors 440 (e.g., logic transistors, memory selector transistors, and/or other types of transistors, as discussed herein) formed on the substrate 402. The device layer 404 may include, for example, one or more source and/or drain (S/D) regions 420, a gate 422 to control current flow in the transistors 440 between the S/D regions 420, and one or more S/D contacts 424 to route electrical signals to/from the S/D regions 420. The transistors 440 may include additional features not depicted for the sake of clarity, such as device isolation regions, gate contacts, and the like. The transistors 440 are not limited to the type and configuration depicted in FIG. 4 and may include a wide variety of other types and configurations such as, for example, planar transistors, non-planar transistors, or a combination of both. Non-planar transistors may include Fin-based transistors, such as double-gate transistors or tri-gate transistors, and wrap-around or all-around gate transistors, such as nanoribbon and nanowire transistors.

Electrical signals, such as power and/or input/output (I/O) signals, may be routed to and/or from the transistors 440 of the device layer 404 through one or more interconnect layers 406a-d disposed on the device layer 404. For example, electrically conductive features of the device layer 404 (e.g., the gate 422 and the S/D contacts 424) may be electrically coupled with the interconnect structures 428 of the interconnect layers 406a-d. The one or more interconnect layers 406a-d may form an interlayer dielectric (ILD) stack of the IC device 400.

The interconnect structures 428 may be arranged within the interconnect layers 406a-d to route electrical signals according to a wide variety of designs (in particular, the arrangement is not limited to the particular configuration of interconnect structures 428 depicted in FIG. 4). Although a particular number of interconnect layers 406a-d is depicted in FIG. 4, embodiments of the present disclosure include IC devices having more or fewer interconnect layers than depicted.

In some embodiments, the interconnect structures 428 may include trench structures 428a (sometimes referred to as "lines") and/or via structures 428b filled with an electrically conductive material such as a metal. The trench structures 428a may be arranged to route electrical signals in a direction of a plane that is substantially parallel with a surface of the substrate 402 upon which the device layer 404 is formed. For example, the trench structures 428a may route electrical signals in a direction in and out of the page from the perspective of FIG. 4. The via structures 428b may be arranged to route electrical signals in a direction of a plane that is substantially perpendicular to the surface of the substrate 402 upon which the device layer 404 is formed. In some embodiments, the via structures 428b may electrically couple trench structures 428a of different interconnect layers 406a-d together.

The interconnect layers 406a-d may include a dielectric material 426 disposed between the interconnect structures 428, as shown in FIG. 4. In some embodiments, the dielectric material 426 disposed between the interconnect structures 428 in different ones of the interconnect layers 406a-d may have different compositions; in other embodiments, the composition of the dielectric material 426 between different interconnect layers 406a-d may be the same. In either case, such dielectric materials may be referred to as inter-layer dielectric (ILD) materials.

A first interconnect layer 406a (referred to as Metal 1 or "M1") may be formed directly on the device layer 404. In some embodiments, the first interconnect layer 406a may include trench structures 428a and/or via structures 428b, as shown. The trench structures 428a of the first interconnect layer 406a may be coupled with contacts (e.g., the S/D contacts 424) of the device layer 404.

A second interconnect layer 406b (referred to as Metal 2 or "M2") may be formed directly on the first interconnect layer 406a. In some embodiments, the second interconnect layer 406b may include via structures 428b to couple the trench structures 428a of the second interconnect layer 406b with the trench structures 428a of the first interconnect layer 406a. Although the trench structures 428a and the via structures 428b are structurally delineated with a line within each interconnect layer (e.g., within the second interconnect layer 408) for the sake of clarity, the trench structures 428a and the via structures 428b may be structurally and/or materially contiguous (e.g., simultaneously filled during a dual-damascene process) in some embodiments.

In some embodiments, a third interconnect layer 410 (referred to as Metal 3 or "M3") and a fourth interconnect layer 406d (referred to as Metal 4 or "M4") (and additional interconnect layers, as desired) may be formed in succession on the second interconnect layer 406b according to similar techniques and configurations described in connection with the second interconnect layer 406b or the first interconnect layer 406a.

In various embodiments, the TFT 450 of the voltage regulator may be formed in the back-end of the IC device 400, e.g., above one or more of the interconnect layers 406a-d. The TFT 450 may include a gate electrode 452, a gate oxide 456, a channel layer 458, a source electrode 460, a drain electrode 462, and a spacer 464, as previously described. The TFT 450 may be formed on an ILD 466.

In some embodiments, one or more resistors 468, inductors 470, and/or capacitors 472 may be formed in the back-end of the IC device 400 (e.g., above or below the TFT 450). One or more of the resistors 468, inductors 470, and/or capacitors 472 may be included in the voltage regulator with the TFT 450.

In some embodiments, one or more additional interconnect layers (not shown) may be formed in and/or above the layers that include the TFT 450, resistors 468, inductors 470, and/or capacitors 472 (e.g., to couple the TFT 450 with one or more of the resistors 468, inductors 470, capacitors 472, and/or other components of the voltage regulator).

As shown in FIG. 4, the TFT 450 of the voltage regulator does not consume area of the device layer 404, thereby freeing up area of the device layer 404 for transistors 440 (e.g., logic transistors). In some embodiments, the TFT 450 may be disposed over one or more transistors 440 in the device layer 404.

In various embodiments, the apparatuses described herein (e.g., voltage regulator 102, load 108, voltage regulator circuit 200, TFT 300, and/or IC device 400) may be formed on a respective dies of a wafer. For example, FIGS. 5 and 6 are top views of a wafer and dies that include one or more voltage regulators, in accordance with any of the embodiments disclosed herein.

Figure 6:
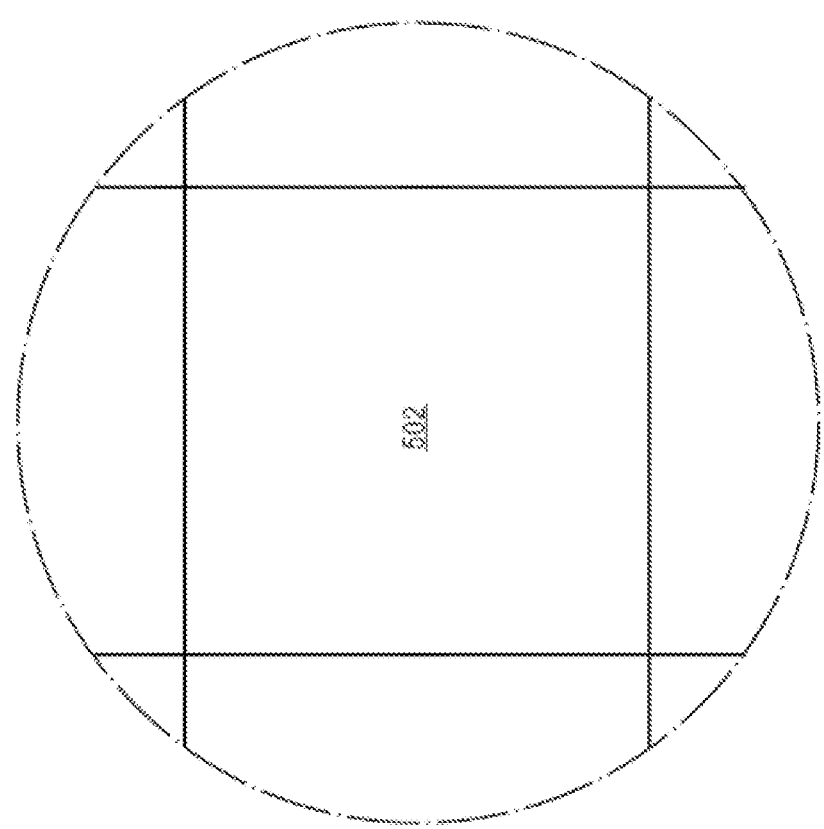
FIGS. 5 and 6 are top views of a wafer and dies that include a voltage regulator circuit with one or more thin-film transistors, in accordance with one or more of the embodiments disclosed herein.
Figure 5:
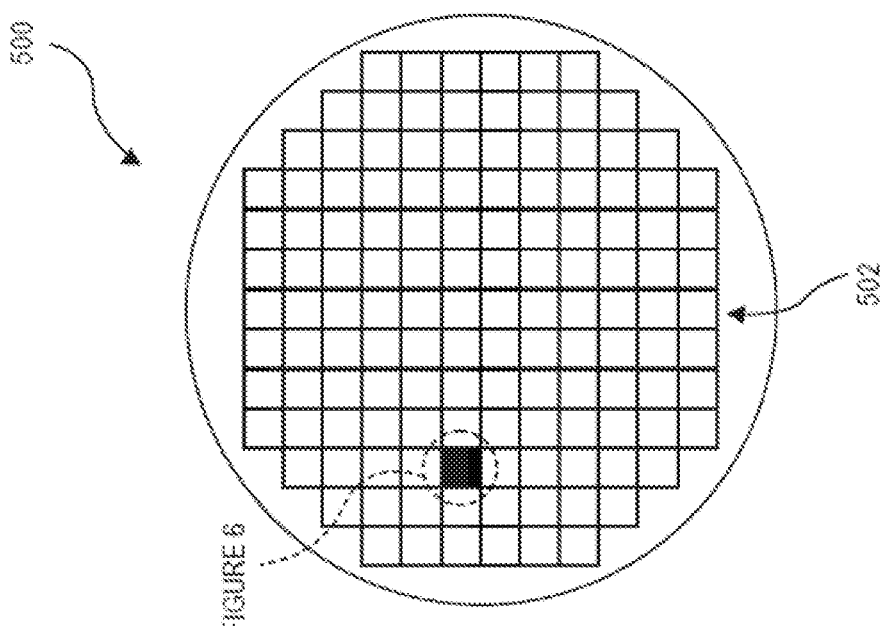

Referring to FIGS. 5 and 6, a wafer 500 may be composed of semiconductor material and may include one or more dies 502 having IC structures formed on a surface of the wafer 500. Each of the dies 502 may be a repeating unit of a semiconductor product that includes any suitable IC (e.g., memory cell 100, memory circuit 200, IC device 300, and/or IC device 400). After the fabrication of the semiconductor product is complete, the wafer 500 may undergo a singulation process in which each of the dies 502 is separated from one another to provide discrete "chips" of the semiconductor product. In particular, devices that include the memory circuit as disclosed herein may take the form of the wafer 500 (e.g., not singulated) or the form of the die 502 (e.g., singulated). The die 502 may include one or more transistors and/or supporting circuitry to route electrical signals to the transistors, as well as any other IC components. In some embodiments, the wafer 500 or the die 502 may include a memory device (e.g., a static random access memory (SRAM) device), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processing device or other logic that is configured to store information in the memory devices or execute instructions stored in the memory array.

Figure 7:
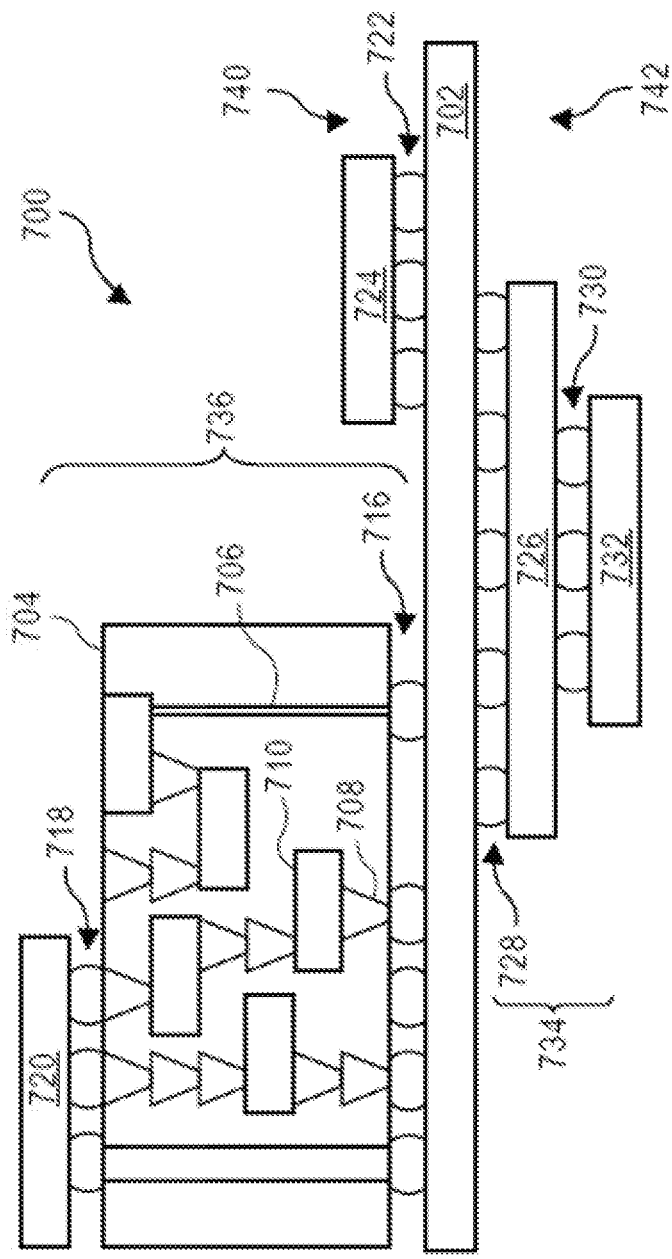
FIG. 7 is a cross-sectional side view of an integrated circuit (IC) device assembly that may include a voltage regulator circuit with one or more thin-film transistors, in accordance with one or more of the embodiments disclosed herein.

FIG. 7 is a cross-sectional side view of an integrated circuit (IC) device assembly 700 that may include one or more voltage regulators (e.g., the voltage regulator circuit 102 or 200) including one or more TFTs (e.g., corresponding to the one or more TFTs 104, the TFT 202, the TFT 300, and/or the TFT 450), in accordance with one or more of the embodiments disclosed herein.

The IC device assembly 700 includes a number of components disposed on a circuit board 702 (which may be, e.g., a motherboard). The IC device assembly 700 includes components disposed on a first face 740 of the circuit board 702 and an opposing second face 742 of the circuit board 702. Generally, components may be disposed on one or both faces 740 and 742. In particular, any suitable ones of the components of the IC device assembly 700 may include one or more of the voltage regulator circuits 102 and/or 200 disclosed herein.

In some embodiments, the circuit board 702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 702. In other embodiments, the circuit board 702 may be a non-PCB substrate.

The IC device assembly 700 illustrated in FIG. 7 includes a package-on-interposer structure 736 coupled to the first face 740 of the circuit board 702 by coupling components 716. The coupling components 716 may electrically and mechanically couple the package-on-interposer structure 736 to the circuit board 702, and may include solder balls (as shown in FIG. 7), male and female portions of a socket, an adhesive, an underfill material, and/or any other suitable electrical and/or mechanical coupling structure.

The package-on-interposer structure 736 may include an IC package 720 coupled to an interposer 704 by coupling components 718. The coupling components 718 may take any suitable form for the application, such as the forms discussed above with reference to the coupling components 716. Although a single IC package 720 is shown in FIG. 7, multiple IC packages may be coupled to the interposer 704. It is to be appreciated that additional interposers may be coupled to the interposer 704. The interposer 704 may provide an intervening substrate used to bridge the circuit board 702 and the IC package 720. The IC package 720 may be or include, for example, a die (the die 502 of FIG. 6), an IC device (e.g., the IC device 400 of FIG. 4), or any other suitable component. Generally, the interposer 704 may spread a connection to a wider pitch or reroute a connection to a different connection. For example, the interposer 704 may couple the IC package 720 (e.g., a die) to a ball grid array (BGA) of the coupling components 716 for coupling to the circuit board 702. In the embodiment illustrated in FIG. 7, the IC package 720 and the circuit board 702 are attached to opposing sides of the interposer 704. In other embodiments, the IC package 720 and the circuit board 702 may be attached to a same side of the interposer 704. In some embodiments, three or more components may be interconnected by way of the interposer 704.

The interposer 704 may be formed of an epoxy resin, a fiberglass-reinforced epoxy resin, a ceramic material, or a polymer material such as polyimide. In some implementations, the interposer 704 may be formed of alternate rigid or flexible materials that may include the same materials described above for use in a semiconductor substrate, such as silicon, germanium, and other group III-V and group IV materials. The interposer 704 may include metal interconnects 708 and vias 710, including but not limited to through-silicon vias (TSVs) 706. The interposer 704 may further include embedded devices 714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 704. The package-on-interposer structure 736 may take the form of any of the package-on-interposer structures known in the art.

The IC device assembly 700 may include an IC package 724 coupled to the first face 740 of the circuit board 702 by coupling components 722. The coupling components 722 may take the form of any of the embodiments discussed above with reference to the coupling components 716, and the IC package 724 may take the form of any of the embodiments discussed above with reference to the IC package 720.

The IC device assembly 700 illustrated in FIG. 7 includes a package-on-package structure 734 coupled to the second face 742 of the circuit board 702 by coupling components 728. The package-on-package structure 734 may include an IC package 726 and an IC package 732 coupled together by coupling components 730 such that the IC package 726 is disposed between the circuit board 702 and the IC package 732. The coupling components 728 and 730 may take the form of any of the embodiments of the coupling components 716 discussed above, and the IC packages 726 and 732 may take the form of any of the embodiments of the IC package 720 discussed above. The package-on-package structure 734 may be configured in accordance with any of the package-on-package structures known in the art.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
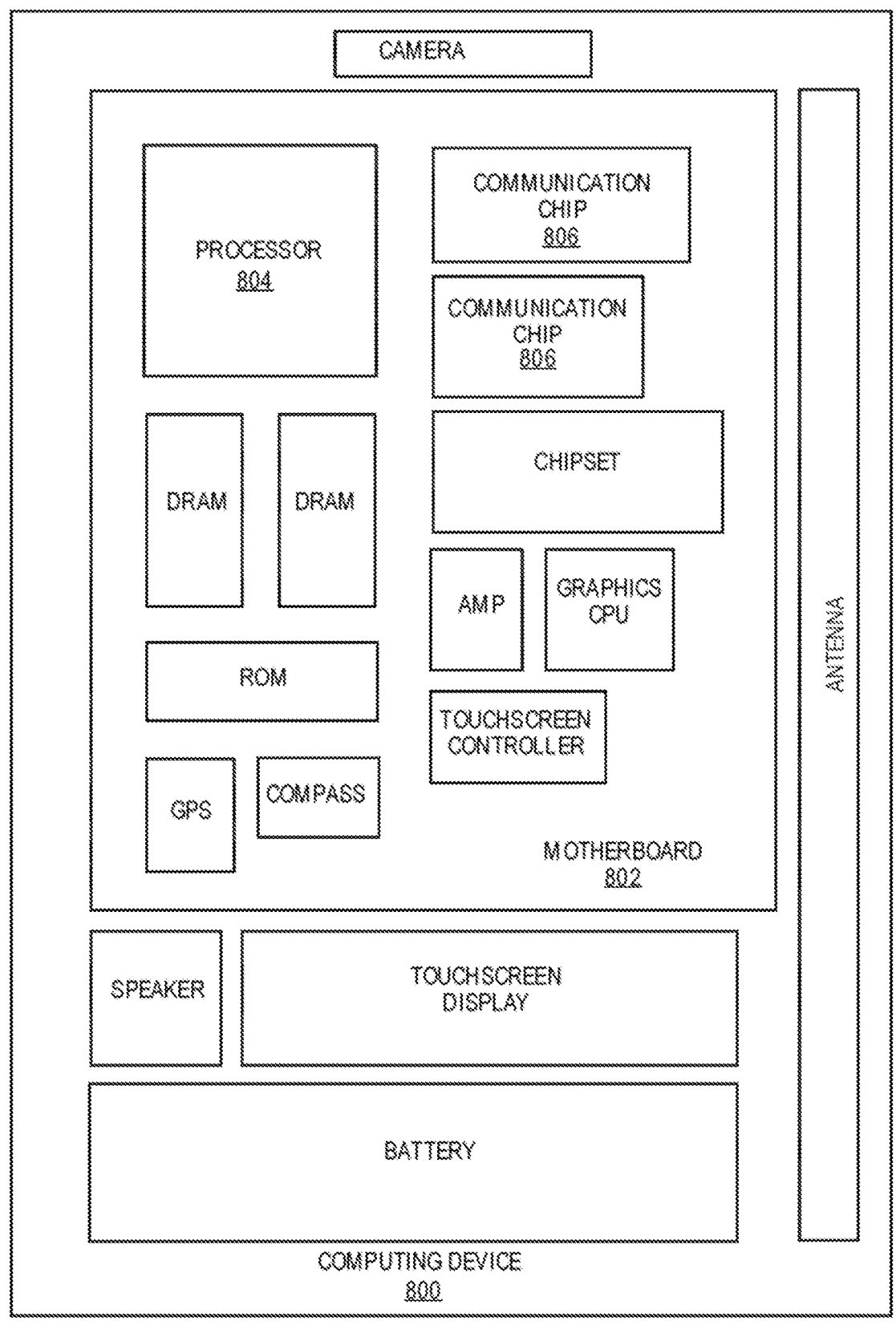
FIG. 8 illustrates a computing device in accordance with one implementation of an embodiment of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes one or more voltage regulators with one or more TFTs, in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of embodiments of the disclosure, the integrated circuit die of the communication chip includes one or more voltage regulators with one or more TFTs, in accordance with implementations of embodiments of the disclosure.

In further implementations, another component housed within the computing device 800 may contain an integrated circuit die that includes one or more voltage regulators with one or more TFTs, in accordance with implementations of embodiments of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Some non-limiting Examples of various embodiments are provided below.

Example 1 is a voltage regulator comprising: an input node to receive an input voltage; an output node; and a voltage regulator circuit to receive the input voltage at the input node and generate a regulated output voltage at the output node, wherein the voltage regulator circuit includes a thin-film transistor (TFT).

Example 2 is the voltage regulator of Example 1, wherein the TFT includes a channel layer having a base material and a dopant, and wherein the dopant includes includes nitrogen, argon, fluorine, chlorine, or xenon.

Example 3 is the voltage regulator of Example 2, wherein the base material includes a semiconductor.

Example 4 is the voltage regulator of Example 2, wherein the dopant has a concentration in the channel layer of 1E16 to 1E19 atoms per cubic centimeter.

Example 5 is the voltage regulator of any one of Examples 1 to 4, wherein the TFT includes a gate oxide layer having a thickness of 5 nanometers to 30 nanometers.

Example 6 is the voltage regulator of Example 5, wherein the gate oxide layer includes: silicon and nitrogen; hafnium and oxygen; aluminum and oxygen; silicon and oxygen; aluminum and nitrogen; silicon, oxygen, and nitrogen; yttrium and oxygen; tantalum and oxygen; or titanium and oxygen.

Example 7 is the voltage regulator of Example 1, wherein the voltage regulator circuit is to provide the regulated output voltage to a load that is coupled to the output node and is disposed on a same integrated circuit die as the voltage regulator circuit.

Example 8 is the voltage regulator of Example 1, wherein the TFT is over a front-end transistor and one or more interconnect layers of an integrated circuit die that includes the voltage regulator circuit.

Example 9 is the voltage regulator of Example 1, wherein the voltage regulator is a single-stage voltage regulator.

Example 10 is the voltage regulator of Example 1, wherein the voltage regulator circuit is a linear voltage regulator circuit.

Example 11 is the voltage regulator of Example 1, wherein the voltage regulator circuit is a switching voltage regulator circuit.

Example 12 is an integrated circuit (IC) die comprising: a circuit block including front-end transistors formed in a device layer on a semiconductor substrate; and a voltage regulator circuit to provide a regulated output voltage to the circuit block, the voltage regulator circuit including a thin-film transistor formed in a back-end of the IC die that is above the device layer.

Example 13 is the IC die of Example 11, wherein the TFT includes a channel layer having a base material and a dopant, and wherein the dopant includes nitrogen, argon, fluorine, chlorine, or xenon.

Example 14 is the IC die of Example 12 or Example 13, wherein the TFT includes a gate oxide layer having a thickness of 5 nanometers to 30 nanometers.

Example 15 is the IC die of Example 14, wherein the gate oxide layer includes: silicon and nitrogen; hafnium and oxygen; aluminum and oxygen; silicon and oxygen; aluminum and nitrogen; silicon, oxygen, and nitrogen; yttrium and oxygen; tantalum and oxygen; or titanium and oxygen.

Example 16 is the IC die of Example 11, wherein the voltage regulator circuit is a single-stage voltage regulator circuit.

Example 17 is the IC die of Example 11, wherein the voltage regulator circuit is a linear voltage regulator circuit or a switching voltage regulator circuit.

Example 18 is a computing system, comprising: a circuit board; and an integrated circuit (IC) die coupled to the circuit board. The IC die of Example 18 includes: logic circuitry; and a voltage regulator circuit coupled to the logic circuitry to provide the logic circuitry with a regulated supply voltage, wherein the voltage regulator circuit includes a thin-film transistor (TFT), and wherein the TFT includes a channel layer having a base material and a dopant.

Example 19 is the computing system of Example 18, wherein the dopant includes nitrogen, argon, fluorine, chlorine, or xenon.

Example 20 is the computing system of Example 18, wherein the TFT further includes a gate oxide layer having a thickness of 5 nanometers to 30 nanometers.

Example 21 is the computing system of Example 20, wherein the gate oxide layer includes: silicon and nitrogen; hafnium and oxygen; aluminum and oxygen; silicon and oxygen; aluminum and nitrogen; silicon, oxygen, and nitrogen; yttrium and oxygen; tantalum and oxygen; or titanium and oxygen.

Example 22 is the computing system of Example 18, wherein the voltage regulator circuit is a linear voltage regulator circuit or a switching voltage regulator circuit.

Example 23 is the computing system of Example 18, further comprising a power supply circuit coupled to the IC die to provide the IC die with a main power supply, wherein the voltage regulator circuit is to generate the regulated supply voltage from the main power supply.

Example 24 is the computing system of any one of Examples 18 to 23, further comprising one or more of an antenna, a display, a network adapter, or a memory device coupled to the IC die.

Example 25 is a method for fabricating an integrated circuit (IC) die, the method comprising: forming a front-end transistor on a substrate; forming a thin-film transistor (TFT) above the front-end transistor; and forming a voltage regulator circuit that includes the TFT. Forming the TFT includes: forming a gate electrode above the front-end transistor; forming a gate oxide layer on the gate electrode; forming a channel layer of a base material on the gate oxide layer; and treating the channel layer with a gas or plasma; and forming a voltage regulator circuit including the TFT.

Example 26 is the method of Example 25, wherein the gas or plasma includes includes nitrogen, argon, fluorine, chlorine, or xenon.

Example 27 is the method of Example 26, wherein the base material includes indium, gallium, zinc, and oxygen.

Example 28 is the method of Example 25, wherein the gate oxide layer is formed with a thickness of 5 to 30 nanometers.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

What is claimed is:

1. A voltage regulator comprising:
an input node to receive an input voltage;
an output node;
a voltage regulator circuit to receive the input voltage at the input node and generate a regulated output voltage at the output node, wherein the voltage regulator circuit includes a thin-film transistor (TFT);
wherein the TFT includes a channel layer that includes an oxide semiconductor material, wherein the channel layer includes a dopant; and
wherein the dopant includes a concentration gradient within the channel layer, wherein a higher concentration of the dopant is at a side of the channel layer proximate to a source or a drain of the TFT, and wherein an entirety of a bottom of the channel layer is in a same plane, and wherein the channel layer is a back end of line channel layer, wherein the TFT is over one or more back end of line interconnect layers, and wherein the one or more interconnect layers are over a front-end transistor.

2. The voltage regulator of claim 1, wherein the oxide semiconductor material includes indium, gallium, zinc, and oxygen.

3. The voltage regulator of claim 2, wherein the dopant has a concentration in the channel layer of 1E16 to 1E19 atoms per cubic centimeter.

4. The voltage regulator of claim 1, wherein the dopant includes a selected one or more of: fluorine, chlorine, or xenon.

5. The voltage regulator of claim 1, wherein the TFT includes a gate oxide layer having a thickness of 5 nanometers to 30 nanometers.

6. The voltage regulator of claim 1, wherein the voltage regulator circuit is configured to provide the regulated output voltage to a load that is coupled to the output node and is disposed on a same integrated circuit die as the voltage regulator circuit.

7. The voltage regulator of claim 1, wherein the voltage regulator is a single-stage voltage regulator.

8. The voltage regulator of claim 1, wherein the voltage regulator circuit is a selected one of: a linear voltage regulator circuit or a switching voltage regulator circuit.

* * * * *